(12) United States Patent
Balster et al.

(10) Patent No.: US 7,312,119 B2
(45) Date of Patent: Dec. 25, 2007

(54) STACKED CAPACITOR AND METHOD OF FABRICATING SAME

(75) Inventors: Scott Gerard Balster, Dallas, TX (US); Badih El-Kareh, Cedar Park, TX (US); Philipp Steinman, Richardson, TX (US); Christoph Dirnecker, Haag (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/549,248

(22) Filed: Oct. 13, 2006

(65) Prior Publication Data

US 2007/0069269 A1    Mar. 29, 2007

Related U.S. Application Data

(62) Division of application No. 10/830,629, filed on Apr. 22, 2004, now Pat. No. 7,130,182.

(30) Foreign Application Priority Data

May 27, 2003   (DE) ................. 103 24 066

(51) Int. Cl.
*H01L 21/8242* (2006.01)
*H01L 21/20* (2006.01)

(52) U.S. Cl. ................. 438/253; 438/396; 257/E21.008

(58) Field of Classification Search ........ 257/E21.008, 257/E21.396, E21.647, E21.648
See application file for complete search history.

(56) References Cited

U.S. PATENT DOCUMENTS

| | | | |
|---|---|---|---|
| 4,731,696 A | 3/1988 | Himes et al. | |
| 5,162,890 A | 11/1992 | Butler | |
| 5,466,629 A * | 11/1995 | Mihara et al. | 438/3 |
| 5,572,052 A | 11/1996 | Kashihara et al. | |
| 5,856,223 A | 1/1999 | Wang | |
| 6,064,108 A | 5/2000 | Martinez | |
| 6,278,147 B1 | 8/2001 | Dalton et al. | |
| 6,313,516 B1 | 11/2001 | Tsui et al. | |
| 6,365,954 B1 | 4/2002 | Dasgupta | |
| 6,686,237 B1 | 2/2004 | Wofford et al. | |
| 6,833,299 B2 * | 12/2004 | Coolbaugh et al. | 438/238 |
| 6,921,962 B1 | 7/2005 | Bailey et al. | |
| 6,998,663 B2 | 2/2006 | Yoshitomi et al. | |

FOREIGN PATENT DOCUMENTS

| | | |
|---|---|---|
| DE | 4322354 A1 | 1/1994 |
| EP | 1067600 A1 | 1/2001 |
| EP | 1205976 A2 | 1/2002 |

* cited by examiner

*Primary Examiner*—Scott B. Geyer
(74) *Attorney, Agent, or Firm*—Jacqueline J. Garner; W. James Brady, III; Frederick J. Telecky, Jr.

(57) ABSTRACT

The invention relates to a stacked capacitor (10) comprising a silicon base plate (16), a poly-silicon center plate (32) arranged above the base plate (16), a lower gate-oxide dielectric (26) arranged between the base plate (16) and the center plate (32), a cover plate (36) made of a metallic conductor and arranged above the center plate (32), and an upper dielectric (34) arranged between the center plate (32) and the cover plate (36). The cover plate (36) and the base plate (16) are electrically connected to each other and together form a first capacitor electrode. The center plate (32) forms a second capacitor electrode. The invention further relates to an integrated circuit with such a stacked capacitor, as well as to a method for fabrication of a stacked capacitor as part of a CMOS process.

6 Claims, 1 Drawing Sheet

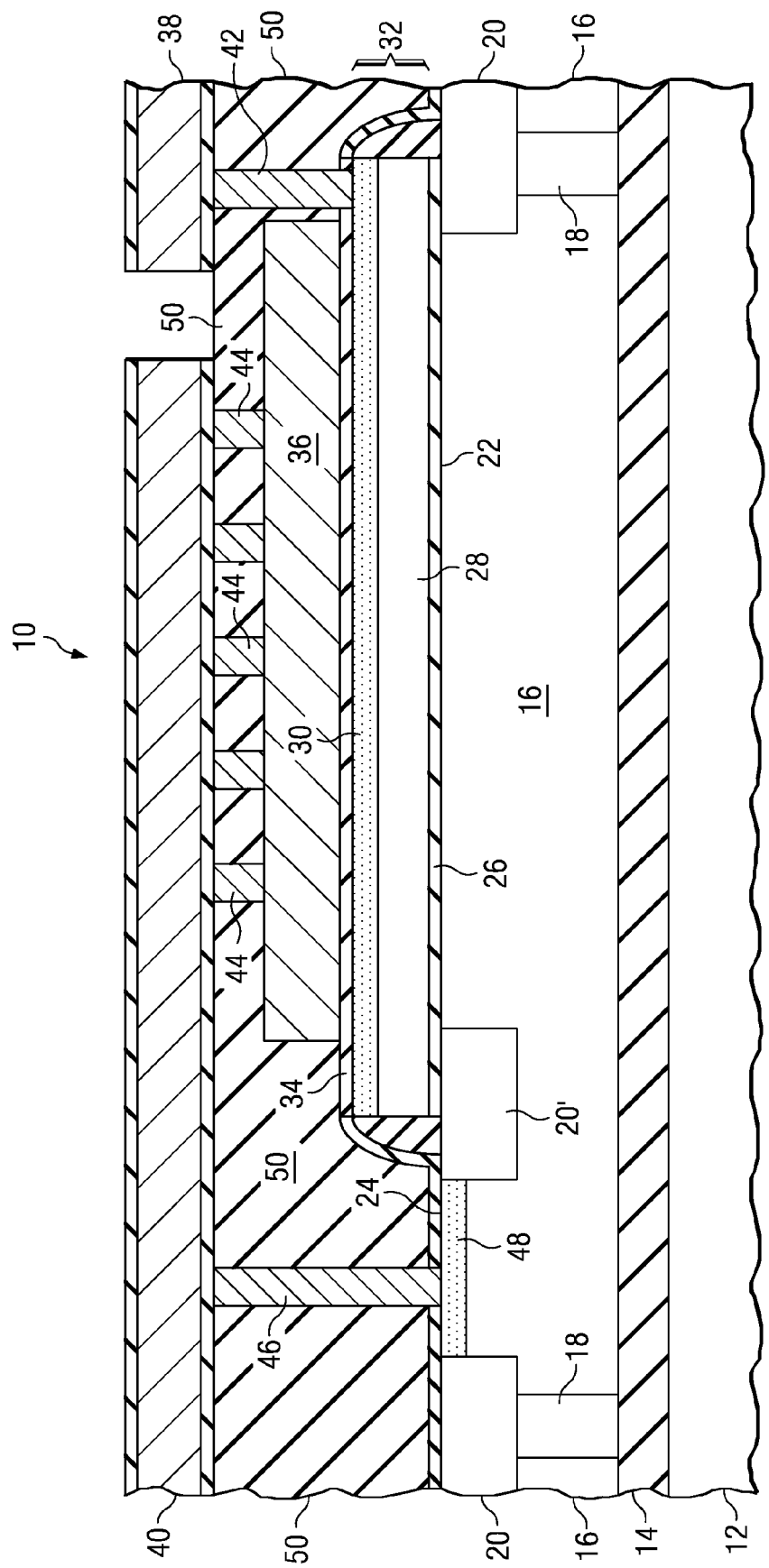

STACKED CAPACITOR AND METHOD OF FABRICATING SAME

This is a divisional application of Ser. No. 10/830,629 filed Apr. 22, 2004 now U.S. Pat. No. 7,130,182.

FIELD OF THE INVENTION

The invention relates to a stacked capacitor, an integrated circuit containing such a stacked capacitor, and a method for fabricating a stacked capacitor as part of a CMOS process.

BACKGROUND OF THE INVENTION

The requirement for ever increasing package densities demands that the structure of the individual circuit components must become even smaller. However, physical constraints set limits to increasing miniaturisation. Especially, for capacitors whose capacity depends directly on the plate surface a reduction in surface demands is therefore desirable.

SUMMARY OF THE INVENTION

The invention provides a stacked capacitor consisting of a silicon base plate, a poly-silicon center plate arranged above the base plate, a lower gate-oxide dielectric arranged between the base plate and the center plate, a cover plate made of a metallic conductor and arranged above the center plate, and an upper dielectric arranged between the center plate and the cover plate, the cover plate and the base plate being electrically connected to each other and together forming a first capacitor electrode, the center plate forming a second capacitor electrode. The formation of the stacked capacitor with three plates, where the two outer ones are connected to each other to form a common capacitor electrode, reduces the surface area requirement of the capacitor by half in comparison with a two-plate capacitor. Between the heavily-doped silicon base plate and the poly-silicon center plate, high capacitance values can be achieved as a result of this material combination. All three plates, as well as their intermediate dielectric layers, can be produced without additional resources in one manufacturing process of an integrated semiconductor circuit, since the corresponding layers are already available in this sequence as part of the manufacturing process. The stacked capacitor according to the invention can, therefore, be realized within an integrated circuit very easily and at low cost.

According to a preferred embodiment of the invention, the cover plate is made of titanium nitride or of a titanium alloy. The use of titanium nitride or of a titanium alloy for the cover plate requires no additional resources for the manufacture of the capacitor, either, since these materials are used during the manufacturing process for the formation of barriers prior to the metallization for the connection points for the circuit elements. By the use of titanium nitride or a titanium alloy, capacitance values can be achieved between the cover plate and the center plate, that are very little voltage-dependent. The voltage dependency of the capacitance between the heavily doped silicon base plate and the poly-silicon center plate can, therefore, be compensated, at least in part, by connecting both capacitor sections in parallel. The stacked capacitor according to the invention is particularly suited for use as a decoupling capacitor, since high capacity is of high priority for decoupling capacitors, whilst their voltage dependency is of rather less importance.

According to a further aspect, the invention provides an integrated circuit comprising such a capacitor. Because of its high capacitance per surface area, such an integrated circuit offers the advantage that the surface area occupied by the stacked capacitor is less than that used in circuits by conventional capacitors.

According to a further aspect, the invention also provides for a method for the fabrication of a stacked capacitor in a CMOS process, the method comprising the following steps:

applying a buried silicon layer on a substrate with a buried oxide insulating layer;

heavy n or p doping a portion of the buried silicon layer to form a base plate of the capacitor;

masking a connecting portion within the area of the base plate and forming a lower dielectric of the capacitor within the connecting portion when producing a gate-oxide layer as part of the CMOS process;

applying a poly-silicon layer in the area of the connecting portion to form a center plate of the capacitor;

forming an upper dielectric on the surface of the center plate;

applying a layer of a metallic conductor on the upper dielectric to form a cover plate of the capacitor.

This procedure can be integrated, without use of additional resources and, therefore, at very low cost, into an existing CMOS or BiCMOS process for the production of an integrated circuit. The CMOS process already includes the steps used in the method according to the invention for the formation of the capacitor plates and of the dielectric layers. It should be noted, in particular, that no further intermediate steps for layer masking will be necessary.

Further advantageous embodiments of the invention result from the sub-claims.

BRIEF DESCRIPTION OF THE DRAWING

The invention shall be described in the following with reference to a preferred embodiment. Reference shall also be made to the attached drawing, which shows a schematic section through a stacked capacitor according to the invention.

DESCRIPTION OF THE EMBODIMENTS OF THE INVENTION

The stacked capacitor 10 represented in the drawing is an integral part of an integrated circuit, of which the drawing only shows a section that is essential for the description. The integrated circuit is assembled on a silicon substrate 12 that serves as a carrier. A buried oxide layer 14 is formed on the surface of the substrate 12, which serves to insulate the components on upper layers from the substrate 12.

A buried silicon layer is arranged on top of the oxide layer 14, which forms a base plate 16 for the stacked capacitor 10. The base plate 16 is insulated with respect to adjacent circuit components in a conventional manner by deep and shallow trenches 18 and 20, respectively, which are filled with an insulating substance, such as silicon oxide. The base plate 16 is heavily doped, whereby it may be either n or p doped, depending on which type of doping is available in the production process of the integrated circuit, and which is suitable for the area concerned. The surface of the base plate 16 is sectioned by a further shallow trench 20' to form a connecting portion 22 and a contact portion 24, the contact portion 24 being considerably smaller than the connecting portion 22.

The connecting portion 22 is covered by an insulating layer, which forms a lower dielectric 26. The lower dielectric 26 originates from an oxide layer which, in another area of the integrated circuit, forms the insulating layer for the gate of field-effect transistors, and which is therefore termed gate-oxide layer. It extends beyond the connecting portion 22 and also partially covers the shallow trenches 20, 20', to eliminate any border effects.

Arranged above the lower dielectric 26 is a poly-silicon layer 28 that, together with a superposed silicide layer 30, forms the center plate 32 of the stacked capacitor 10. The center plate 32 is, in turn, covered by an insulating layer, which forms an upper dielectric 34. A metallic-conductive layer on top of this finally forms the cover plate 36 of the stacked capacitor 10.

The stacked capacitor 10 is connected by way of metallic conductor tracks 38 and 40 to the conductor network of the integrated circuit. Contacting of the conductor tracks 38 and 40 to the plates of the capacitor 10 is realized by means of contact plugs, made of tungsten, for example, which extend through openings in a protective and compensating layer 50. The first conductor track 38 is connected to the silicide layer 30 of the center plate 32 by means of a contact plug 42. The second conductor track 40 is connected to the cover plate 36 by way of several contact plugs 44, on the one hand; on the other hand there is a connection between the second conductor track 40 and the contact portion 24 of the base plate 16 by way of the contact plug 46. In order to achieve improved contacting properties to the base plate 16, a silicide layer 48 is provided in the area of the contact portion 24.

Thus, the cover plate 36 is electrically connected to the base plate 16 by way of the contact plugs 44, the second conductor track 40 and the contact plug 46. The base plate 16 and the cover plate 36 accordingly form together a first capacitor electrode, whilst the center plate 32 forms the second electrode.

The cover plate 36 preferably consists of TiN or a titanium alloy, such as TiW. Such a cover plate 36, in combination with an upper dielectric 34 of an oxide or nitride, results in a capacitance value of low voltage dependency between the cover plate 36 and the center plate 32. Together with the capacitance connected in parallel between the center plate 32 and the base plate 16, where a higher capacitance value per surface unit is achieved, albeit at the cost of higher voltage dependency, the entire stacked capacitor 10 provides higher capacity per surface area at a satisfactory voltage dependency, as compared with conventional two-plate capacitors.

It has been shown that capacitance values of 3.40 $fF/\mu m^2$ can be achieved with a p-doped base plate 16 with 50 nm of oxide, and 4.70 $fF/\mu m^2$ with nitride. With an n-doped base plate 16 and a 50 nm oxide layer for the upper dielectric 34, a capacitance of 3.15 $fF/\mu m^2$ can be achieved, and a capacitance of 4.45 $fF/\mu m^2$ with a 30 nm nitride layer as the upper dielectric 34, since the heat treatment increases the thickness of the oxide layer over the n-doped base plate by a further 10% approximately. In all the examples, the voltage dependency of the first order is less than 3000 ppm/V, and the voltage dependency of the second order greater than −1000 $ppm/V^2$.

The stacked capacitor 10 according to the invention is particularly suited for decoupling applications, since in these applications less importance is placed on the voltage dependency of the capacitor, rather than on a high capacitance density per surface area.

The method for fabrication of the above-described stacked capacitor 10 as part of a CMOS process shall be described in the following. In this connection, only those process steps are described that are essential for the production of the stacked capacitor. The CMOS process can furthermore comprise further process steps that are not mentioned here.

The starting point is a carrier substrate 12 with a buried oxide layer 14 onto which a silicon layer is applied. Deep and shallow trenches 18 and 20, respectively, are etched into the silicon layer by conventional means, and filled with an insulating material, such as silicon oxide, in order to partition a base plate 16 for the stacked capacitor 10. When etching the shallow trenches 20, a further shallow trench 20' is simultaneously produced within the area of the future base plate 16, which subdivides the surface of the base plate 16 into a connection portion 22 and a contact portion 24.

The base plate 16 is heavily n or p doped, by means of ion implantation, for example. A silicide layer 48 is formed in the area of the contact portion 24, to facilitate contacting of the base plate 16 at a later time.

A gate-oxide layer is now formed on the surface of the integrated circuit in a conventional manner, as required for the formation of the gate insulation in other areas, not shown in the FIGURE, where for example field-effect transistors are to be produced. The gate-oxide layer in the area of the stacked capacitor 10 is then masked and etched so that a section of the gate-oxide layer remains and extends beyond the connection portion 22 and partially covers the shallow trenches 20, 20', which limit the connection portion 22. This portion of the gate-oxide layer forms a lower dielectric 26 of the stacked capacitor 10 to be produced. The thickness of the dielectric 26 over the connecting portion 22 can still increase by approximately 10% during a heat treatment process, when the base plate 16 is heavily p-doped.

In an equally known manner, above the lower dielectric 26 a poly-silicon layer 28, topped by a silicide layer 30, is produced, which together form the center plate 32 of the capacitor. The surface of the center plate 32 is provided with an upper dielectric 34 through an insulating layer, which may consist either of an oxide or a nitride.

A layer made of a metallic conductor is finally applied to the upper dielectric 34, which then forms a cover plate 36 of the capacitor. Suitable as a metallic conductor is a layer of TiN, or a titanium alloy such as TiW, as is applied in a CMOS process before the metallization stage for the purpose of preventing spikes and hollows.

For protection, and to obtain an even level surface, a layer 50 of an insulating material, such as glass, is then applied. Contacting channels are then etched into the insulating layer, which are filled with contact plugs 42, 44, 46 consisting, for example, of tungsten. One or several metallising layers, respectively, from which conductor tracks 38, 40 are etched, electrically connect the stacked capacitor 10 to other components of the integrated circuit.

It follows that the stacked capacitor 10 can be produced as part of a conventional CMOS process without having to resort to additional process steps, in particular without the need for additional masking steps.

The invention claimed is:

1. A method for fabrication of a stacked capacitor as part of a CMOS process, the method comprising the following steps:
   applying a buried silicon layer on a substrate with a buried oxide insulating layer;
   heavy n or p doping a portion of the buried silicon layer to form a base plate of the capacitor;

masking a connecting portion within the area of the base plate and forming a lower dielectric of the capacitor within the connecting portion when producing a gate-oxide layer as part of the CMOS process;

applying a poly-silicon layer in the area of the connecting portion to form a center plate of the capacitor;

forming an upper dielectric on the surface of the center plate;

applying a layer of a metallic conductor on the upper dielectric to form a cover plate of the capacitor.

2. The method according to claim 1, wherein at least part of the poly-silicon layer is covered by a silicide layer prior to the formation of the upper dielectric.

3. The method according to claim 1, wherein the upper dielectric is produced by the formation of an oxide layer.

4. The method according to claim 1, wherein the upper dielectric is produced by the formation of a nitride layer.

5. The method according to claim 4, wherein TiW is used as the metallic conductor for the formation of the cover plate.

6. The method according to claim 1, wherein titanium nitride or a titanium alloy is used as the metallic conductor for the formation of the cover plate.

* * * * *